(12) United States Patent
Johnson et al.

(10) Patent No.: US 6,645,804 B1
(45) Date of Patent: Nov. 11, 2003

(54) SYSTEM FOR FABRICATING A METAL/ANTI-REFLECTIVE COATING/INSULATOR/METAL (MAIM) CAPACITOR

(75) Inventors: F. Scott Johnson, Richardson, TX (US); Luigi Columbo, Dallas, TX (US); Doug Prinslow, McKinney, TX (US); Kelly Taylor, Allen, TX (US); Van-Joy Tsai, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/136,642

(22) Filed: May 1, 2002

Related U.S. Application Data

(60) Provisional application No. 60/344,410, filed on Dec. 28, 2001.

(51) Int. Cl.[7] ............................................. H01L 21/8242
(52) U.S. Cl. ......................................... 438/238; 438/381
(58) Field of Search ................................. 438/250–256, 438/393–399, 238–240, 381

(56) References Cited

U.S. PATENT DOCUMENTS 6,326,301 B1 * 12/2001 Venkatesan et al. ........ 438/638
6,429,474 B1 *  8/2002 Gambino et al. ........... 257/296

* cited by examiner

*Primary Examiner*—Jey Tsai
(74) *Attorney, Agent, or Firm*—Wade James Brady, III; Frederick J. Telecky, Jr.

(57) ABSTRACT

Disclosed is a system for fabricating an integrated circuit capacitor (100). An electrode layer (102) is formed in the integrated circuit. An anti-reflective coating (108) is deposited over the electrode layer (102). An electrode top plate (104) is formed over the anti-reflective coating (108).

20 Claims, 2 Drawing Sheets

SYSTEM FOR FABRICATING A METAL/ANTI-REFLECTIVE COATING/INSULATOR/METAL (MAIM) CAPACITOR

This application claims priority from Provisional Application Ser. No. 60/344,410, filed on Dec. 28, 2001.

FIELD OF THE INVENTION

The invention is generally related to the field of fabricating integrated circuit capacitors and, more specifically, to improving the efficiency of capacitor fabrication by forming the insulator layer of a capacitor from an anti-reflective coating.

BACKGROUND OF THE INVENTION

Since the invention of integrated circuits, the number of devices on a chip has grown at a near-exponential rate. The fabrication methods of the semiconductor industry have been modified and improved continuously for almost four decades. With each improved method, the capacity of a single semiconductor chip has increased from several thousand devices to hundreds of million devices. Future improvements will require integrated circuit devices such as transistors, capacitors, and connections between devices to become even smaller and more densely populated on the chip.

The increased packing density of the integrated circuit generates numerous challenges to the semiconductor manufacturing process. Every device must be smaller without damaging the operating characteristics of the integrated circuit devices. The requirements of high packing density, low heat generation, and low power consumption, with good reliability and long operation life, must be maintained without any functional degradation. Increased packing density of integrated circuits is usually accompanied by smaller feature size.

As integrated circuits become denser, the techniques for fabricating the semiconductor devices must become more precise. Lithography, for example, is one fabrication technique that may be used to remove particular areas of deposited material to define various components of the semiconductor device. Overall device size, however, has become so small that reflected light could remove a detrimental amount of material from adjacent structures. An anti-reflective coating (ARC) layer may be deposited to reduce or eliminate the possibility of reflected light damaging adjacent structures and to improve the resolution of the lithography process.

In addition to more precise manufacturing techniques, semiconductor fabrication must become more efficient to reduce costs for the consumer and remain competitive with other manufacturers. Each step of the fabrication process consumes time, which increases costs and reduces production volume. Because profits are directly related to production volume, any production delay reduces the profits of a manufacturer.

There are a number of conventional capacitor fabrication processes. Several examples of conventional capacitor fabrication processes are depicted in FIGS. 1A–1D. In particular, FIG. 1A depicts a typical metal-insulator-metal (MIM) capacitor fabrication process in which a capacitor 10 has a first electrode 12. A second electrode 14 is separated from the first electrode 12 by a dielectric 16. The first electrode 12 may have multiple layers 18 and 20, which may be configured according to the desired performance characteristics of the capacitor 10. Layer 18, for example, may be a silicided polysilicon or some other type of semiconductor material. Layer 20, for example, may be a metal such as tungsten or titanium nitride. This particular configuration of layers 18, 20, 22, may be combined to fabricate a high capacitance capacitor in an integrated circuit.

FIG. 1B depicts another conventional method of fabricating a capacitor 10 in which the capacitor stack (12, 14, 16, collectively) is deposited immediately after the first half of the via etch. After the capacitor stack (12, 14, 16) is deposited and etched, the second half of the via 24 is formed directly above the first half of the via 24. Fabrication of this particular capacitor 10, however, requires two additional masking steps. One additional masking step is required for the capacitor stack (12, 14, 16) and another additional masking step is required to form the upper half of the vias 24 that connect the second electrode 14 to the semiconductor region 18. The patterning and etching of the capacitor stack (12, 14, 16) may cause damage to the dielectric 16, which could cause leakage within the capacitor 10. Leakage may reduce the performance of the capacitor 10 or cause complete failure of the capacitor 10.

The conventional capacitor fabrication method depicted in FIG. 1C requires only one additional mask. In this particular design, the capacitor stack (12, 14, 16) is deposited and etched immediately prior to the deposition of the metal layer 26. A metal top 26 is added over the second electrode 14. The vias 24 may be formed over the metal top 26 and semiconductor layer 18 may then be deposited. As with the method depicted in FIG. 1B, possible damage to the dielectric may occur during the etching of the capacitor stack (12, 14, 16). Additionally, the topography of the capacitor 10 produced by this method may cause a residue of conducting layer 26 to remain and result in a bypass of electrical current from the second electrode 14 to the first electrode 12, which renders the capacitor 10 ineffective.

Finally, in the conventional capacitor fabrication process depicted in FIG. 1D, the capacitor stack (12, 14, 16) is deposited and etched immediately after the pattering of the metal layer 18. The metal patterning step, however, requires deposition of an ARC (Anti-Reflective Coating) to improve resolution of a lithographic patterning process. Therefore, the ARC used on the metal layer 18 must be removed prior to the deposition of the capacitor stack (12, 14, 16) to allow electrical contact with the first electrode 12.

SUMMARY OF THE INVENTION

Therefore, a system for forming integrated circuit capacitors that does not add excessive costs or procedures to the fabrication process, is now needed, providing for fabrication of more reliable integrated circuit capacitors while overcoming the aforementioned limitations of conventional methods.

The present invention provides a system for fabricating an integrated circuit capacitor. An electrode layer is formed in the integrated circuit. An anti-reflective coating is deposited over the electrode layer. An electrode top plate is formed over the anti-reflective coating.

BRIEF DESCRIPTION OF THE DRAWINGS

For a more complete understanding of the present invention, including its features and advantages, reference is made to the following detailed description, taken in conjunction with the accompanying drawings. Corresponding numerals and symbols in the different figures refer to corresponding parts unless otherwise indicated.

DETAILED DESCRIPTION

While the making and using of various embodiments of the present invention is discussed in detail below, it should be appreciated that the present invention provides many applicable inventive concepts that can be embodied in a wide variety of specific contexts. The specific embodiments discussed herein are merely illustrative of specific ways to make and use the invention, and do not delimit the scope of the invention.

A process according to the present invention reduces or eliminates the inefficiencies of the prior art processes previously depicted and described.

It should be understood that the principles and applications disclosed herein may be applied to a wide range of semiconductor device fabrication processes. For purposes of explanation and illustration, the present invention is hereafter described in reference to a particular capacitor fabrication. The present invention, however, is equally applicable to a variety of fabrication processes.

Figure 1A:
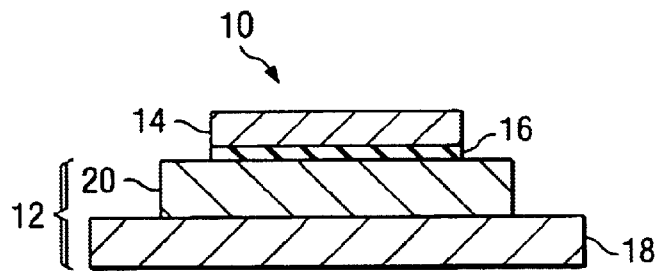
FIGS. 1A–1D depict capacitor fabrication processes in accordance with the prior art.
Figure 1B:
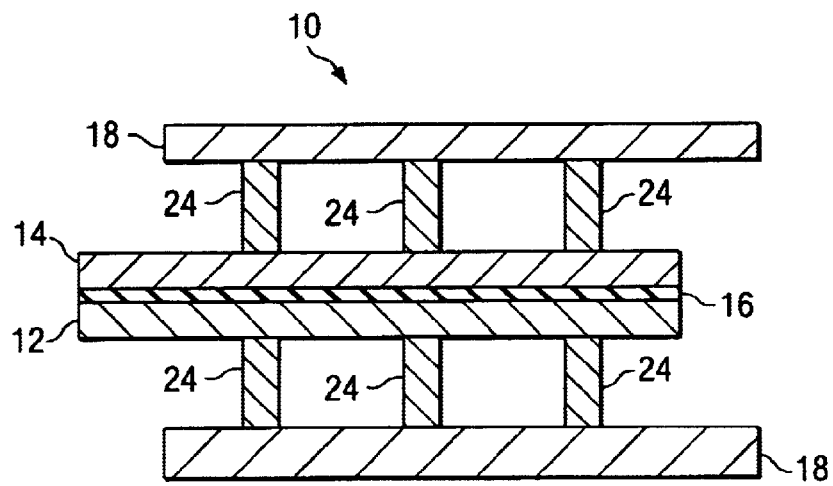
Figure 1C:
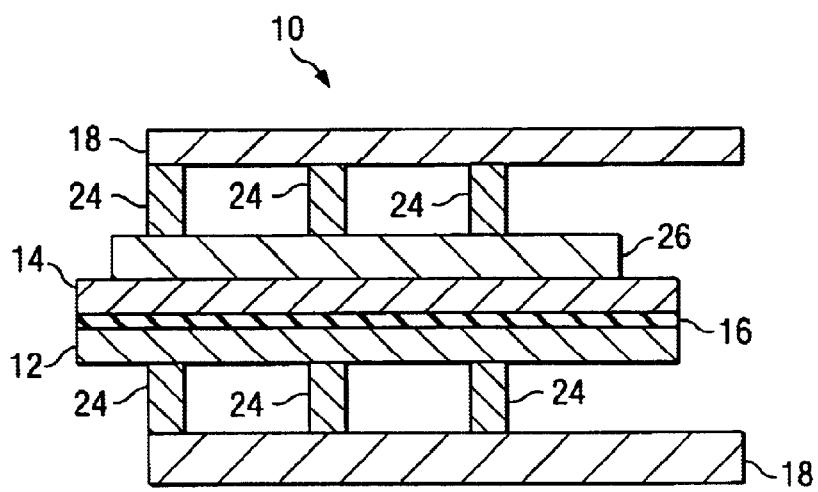
Figure 1D:
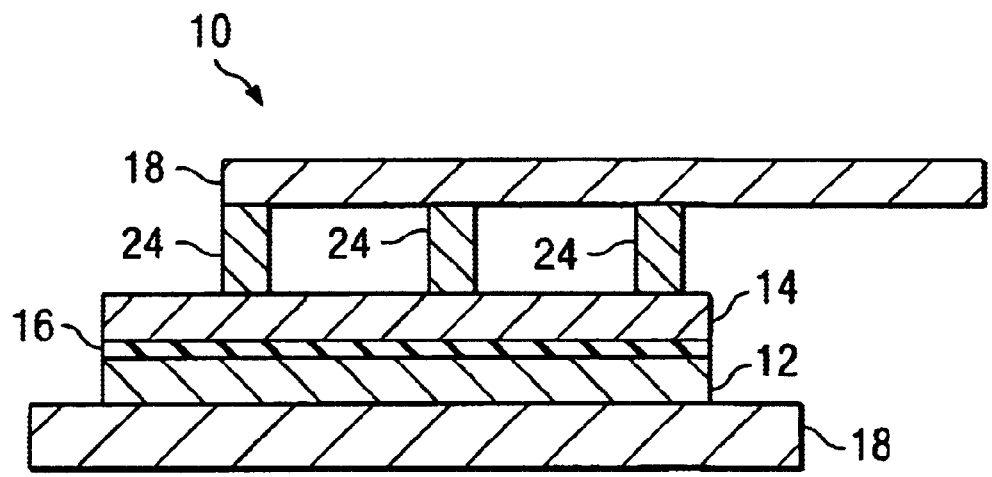
Figure 2:
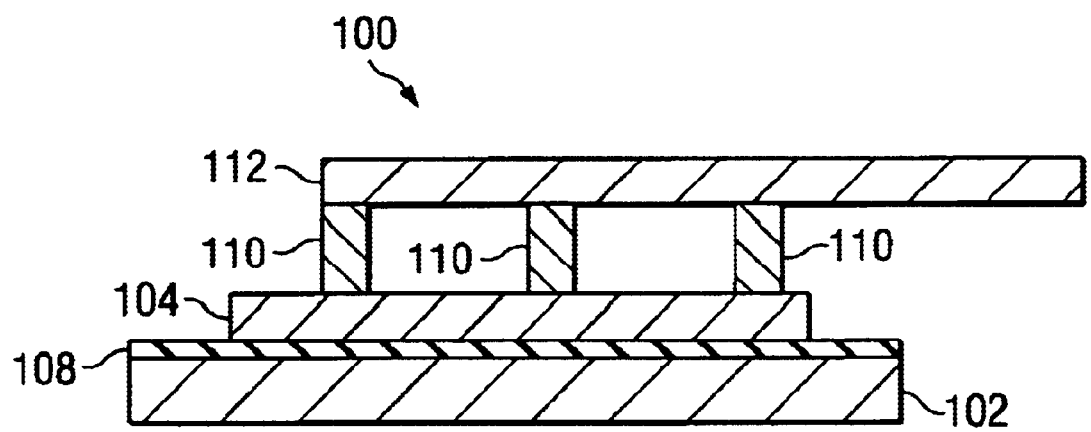
FIG. 2 depicts an embodiment of a capacitor fabrication process in accordance with the present invention.

Turning now to the present invention as depicted in FIG. 2, a capacitor 100 may be formed, for example, using conventional semiconductor fabrication processes. The present invention, however, eliminates a number of costly and time-consuming manufacturing steps required by such conventional capacitor fabrication processes.

A first electrode 102 may be metallic, polysilicon, or some other semiconductor structure suitable for acting as an electrode of a capacitor. An anti-reflective coating dielectric 108 is formed over the first electrode 102. The anti-reflective coating dielectric 108 may be formed by sputtering, chemical vapor deposition, or other suitable methods.

The anti-reflective coating dielectric 108 is formed from silicon oxynitride, although other anti-reflective dielectrics may also be used. The anti-reflective coating dielectric 108 may be deposited prior to patterning, and minimizes the incidence of reflection during photolithography, thus allowing for smaller geometry patterning. The thickness and index of refraction of the anti-reflective coating dielectric 108 are selected for ARC density and thickness, and optimized for capacitance. For example, increasing the thickness of the anti-reflective coating dielectric 108 decreases the capacitance of the capacitor 100, and increases the durability of the anti-reflective coating dielectric 108 for masking purposes. Furthermore, modifying the index of refraction of the anti-reflective coating dielectric 108 enhances the resolution of lithography processes. As a result, the capacitor 100 may be configured for particular performance characteristics, and the anti-reflective coating dielectric 108 will serve as an ARC in subsequent process steps.

The second electrode 104 is deposited over the anti-reflective coating dielectric 108. The second electrode 104 is patterned using a masking step. The second electrode 104 is selectively etched to the anti-reflective coating dielectric 108. After the patterning of the second electrode 104, the anti-reflective coating dielectric 108 remains to allow more precise patterning of the metal layer 112, which may be used for routing. Because the anti-reflective coating dielectric 108 remains at the edges of the electrode 104, capacitor 100 is more immune to leakage and breakage around the perimeter. The fabrication process, consequently, is more efficient and economical because the anti-reflective coating dielectric 108 acts as the dielectric of the capacitor Materials and process steps are saved, because the additional masking steps required by conventional processes are not necessary.

Although this invention has been described with reference to illustrative embodiments, this description is not intended to be construed in a limiting sense. Upon reference to the description, it will be apparent to persons skilled in the art that various modifications and combinations of the illustrative embodiments as well as other embodiments of the invention can be made without departing from the scope of the invention. It is therefore intended that the appended claims encompass any such modifications or embodiments.

What is claimed is:

1. A method of fabricating an integrated circuit capacitor, comprising the steps of:

forming an electrode layer having an upper surface;

depositing an anti-reflective coating over and extending to the edges of the electrode layer;

forming an electrode top plate over a portion of the anti-reflective coating while leaving a portion of the anti-reflective layer exposed; and then patterning a metal layer disposed over and spaced from the electrode top plate.

2. The method of claim 1, further comprising the step of patterning the electrode top plate.

3. The method of claim 1, further comprising the step of forming one or more vias on the electrode top plate.

4. The method of claim 1, wherein the anti-reflective coating is deposited by electrochemical deposition.

5. The method of claim 1, wherein the anti-reflective coating is deposited by chemical vapor deposition.

6. The method of claim 1, wherein the anti-reflective coating is deposited by a spin-on tool.

7. The method of claim 1, wherein the anti-reflective coating is formed from silicon oxynitride.

8. The method of claim 1, wherein the electrode layer is polysilicon.

9. The method of claim 1, wherein the electrode layer is a metal.

10. A method of fabricating an integrated circuit capacitor, comprising the steps of:

depositing a first metallic layer having an upper surface;

depositing an anti-reflective dielectric layer over and extending to the edges of the first metallic layer;

depositing a second metallic layer over a portion of the anti-reflective dielectric layer while leaving a portion of the anti-reflective layer exposed; and then patterning a metal layer disposed over and spaced from the electrode top plate.

11. The method of claim 10, wherein the first metallic layer is AlCu.

12. The method of claim 10, wherein the first metallic layer is formed by electrochemical deposition.

13. The method of claim 10, wherein the second metallic layer is deposited by chemical vapor deposition.

14. The method of claim 10, wherein the first metallic layer is deposited by chemical vapor deposition.

15. The method of claim 10, wherein the second metallic layer is comprised of a first layer of TiN, a second layer of AlCu, and a third layer of TiN.

16. The method of claim 10, wherein the anti-reflective dielectric layer is deposited by chemical vapor deposition.

17. The method of claim 10, wherein the anti-reflective dielectric layer is silicon oxynitride.

18. The method of claim 10, wherein the anti-reflective dielectric layer has a thickness of about between 86 Angstroms and 1000 Angstroms.

19. The method of claim 10, further comprising the step of forming one or more vias on the second metallic layer.

20. A method of fabricating a Metal-Insulator-Metal (MIM) capacitor, comprising the steps of:

forming a metallic electrode having an upper surface;

depositing an anti-reflective insulator over and extending to the edges of the metallic electrode;

forming a metallic electrode top plate over a portion of the anti-reflective insulator while leaving a portion of the anti-reflective insulator exposed; and then patterning a metal layer disposed over and spaced from the electrode top plate.

* * * * *